United States Patent [19]

La Fiandra

[11] 4,390,929
[45] Jun. 28, 1983

[54] PRECISE LAMP POSITIONER
[75] Inventor: Carlo F. La Fiandra, New Canaan, Conn.
[73] Assignee: The Perkin-Elmer Corporation, Norwalk, Conn.
[21] Appl. No.: 262,561
[22] Filed: May 11, 1981
[51] Int. Cl.³ .............................................. F21S 5/00
[52] U.S. Cl. .................................... 362/216; 362/220; 362/223; 362/285; 362/287; 362/288; 362/289; 362/419; 362/427; 362/428
[58] Field of Search ............... 362/216, 220, 221, 285, 362/287, 288, 289, 427, 428, 419; 248/178
[56] References Cited
U.S. PATENT DOCUMENTS
4,244,012 1/1981 Hansen et al. ..................... 362/216

Primary Examiner—Stephen J. Lechert, Jr.
Attorney, Agent, or Firm—S. A. Giarratana; F. L. Masselle; J. D. Crane

[57] ABSTRACT

A precise lamp positioner for moving a lamp relative to a lens. The lamp is carried at one end of an L-shaped pivot plate which is pivoted at its corner to the free end of a pivot arm. The pivot arm is pivoted at its other end to a base. The pivot plate is pivoted about its pivotal connection at its corner by a plate position adjustment means. The pivot arm is pivoted about its pivotal connection to the base by an arm position adjustment means. By adjusting both adjustment means, the lamp position relative to the lens can be precisely set. The pivot plate also pivots about the pivotal connection at its corner so it can swing relative to the base to allow replacing the lamp if it fails.

14 Claims, 6 Drawing Figures

PRECISE LAMP POSITIONER

The present invention relates broadly to the field of positioning devices, and particularly to a precision lamp positioning device useful in projection mask aligners used in the manufacture of semiconductor devices such as LSI chips and the like.

In the field of manufacturing semiconductor devices, projection mask aligners, such as the Micralign TM projection mask aligner manufactured by The Perkin-Elmer Corporation, have been utilized for many years in the manufacture of LSI chips and the like. In such projection mask aligners, an arcuate lamp of the type described in U.S. Pat. No. Re 30,315 is utilized in cooperation with an optical system to produce a uniform illumination on the substrate being exposed by the system. The manufacturing process for these lamps, however, does not permit such lamps to be identically manufactured to produce identical illumination in Micralign TM projection mask aligners. Accordingly, many lamps are manufactured which do not meet the uniformity of illumination requirements of machine users and, therefore, these lamps must be discarded.

Users of Micralign TM projection mask aligners, in some instances, establish illumination uniformity standards which are greater than the standards set by the lamp manufacturer. Accordingly, these users require specially selected lamps which meet their higher illumination uniformity standards. Because of this marketplace requirement, the lamp manufacturer must go through a further manufacturing step to determine the illumination uniformity of each manufactured lamp. This additional step in the manufacturing process contributes to lengthening the manufacturing process of each lamp, which necessitates a higher price to the customer.

In view of the above-mentioned problems, it is the primary object of the present invention to provide a projection mask aligner modification which will permit use, in the modified projection mask aligner, of lamps manufactured by current manufacturing techniques and achieve with these lamps better illumination uniformity than would be achieved if the lamps were used in an unmodified projection mask aligner.

It is a further object of the present invention to provide a modification to a projection mask aligner which produces, with standard lamps therefor, a more uniform illumination than is achievable with unmodified projection mask aligners, while still providing easy access to the lamp, permitting it to be easily removed when it has to be replaced.

It is still another object of the present invention to provide a modification for a projection mask aligner which permits uniform illumination intensity and easy lamp access without a large manufacturing cost increase for the projection mask aligner.

BRIEF DESCRIPTION OF THE INVENTION

In achieving the above-mentioned and other objects of the present invention, a pivot plate with a lamp support thereon is provided. The pivot plate is pivoted about two different axes, and positioning means is provided to position these axes independently with respect to the base of the assembly. By adjusting the position of these axes, the lamp supported by the pivot plate can be moved relative to the projection mask aligner optics. By moving the lamp and measuring the achieved illumination uniformity, the lamp can be located by trial and error at a position which produces the most uniformity of illumination.

The pivot plate is coupled to an access door which, when the door is open, causes the pivot plate to pivot mainly about one of the pivot axes. This causes the lamp carried by the pivot plate to be moved so as to project through an access opening thereby permitting the operator to remove the lamp and replace it with another one. On closing the door, the new lamp is located at the position of the previously used lamp, and position adjustment may become necessary in order to achieve more uniform illumination through the system optics.

BRIEF DESCRIPTION OF THE DRAWING

The foregoing and other objects, advantages and features of the present invention are discussed below in connection with the drawings wherein.

DETAILED DESCRIPTION OF THE INVENTION

Figure 1:
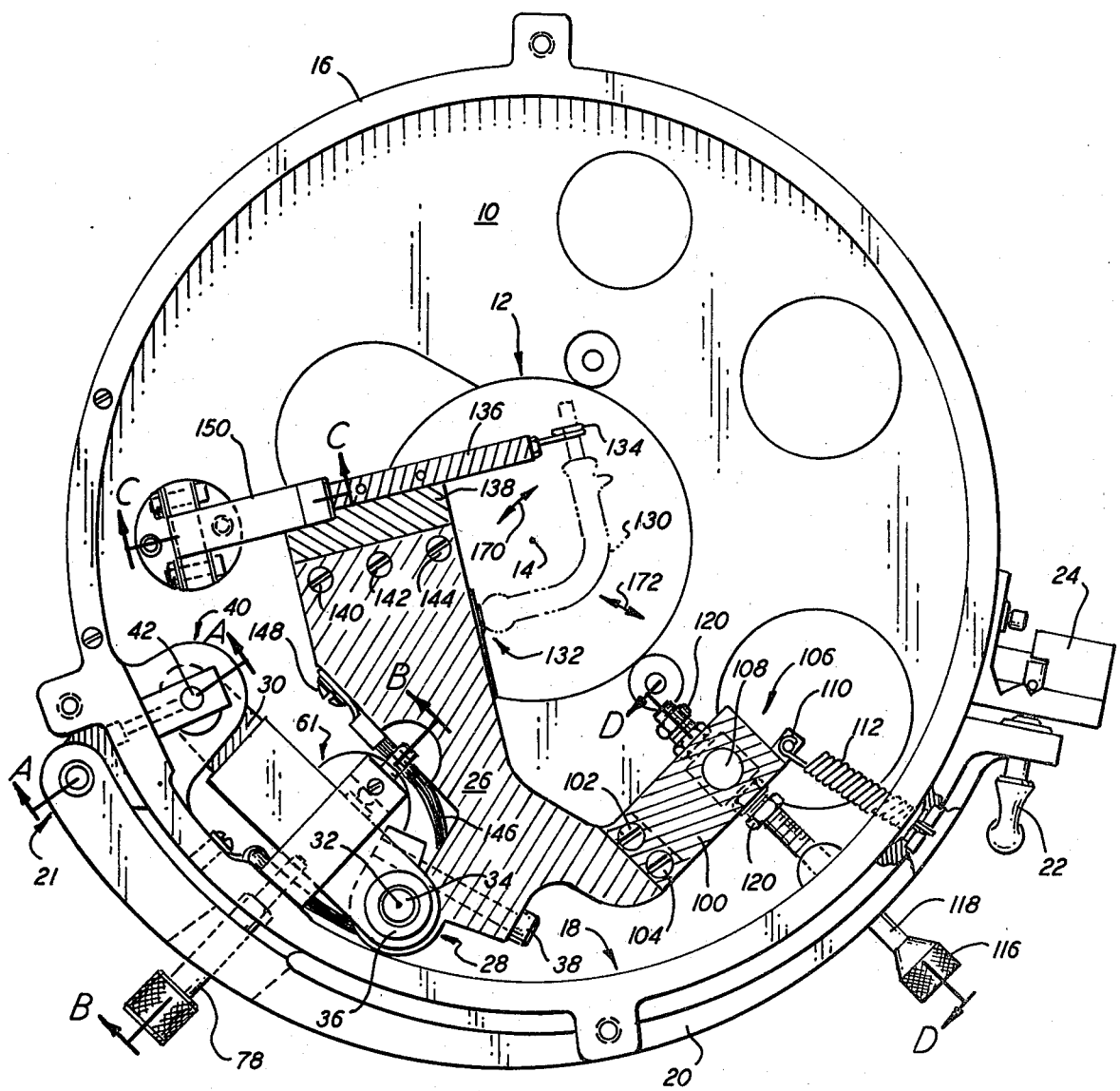
FIG. 1 is a raised, elevational view taken from above the assembly showing the elements as positioned when the access door is closed.

Referring first to FIG. 1, the assembly shown which comprises part of a projection mask aligner which includes a base plate 10 disposed generally in the plane of the sheet of FIG. 1. The base plate 10 is generally circular in shape and has a central circular opening indicated generally at 12, with a vertical axis indicated by the dot 14, which is located at the center of the opening 12, and perpendicular to the plane of the base plate 10. The optics of the projection mask aligner, such as a Micralign TM projection mask aligner manufactured by The Perkin-Elmer Corporation, is disposed symmetrically with respect to the axis 14 and located generally beneath the plane of the base plate 10.

Located around the perimeter of the base plate 10 is a generally cylindrically-shaped wall 16 which extends both upwardly and downwardly from the plane of the base plate 10. The wall 16 about the plate 10 has an opening in the region generally indicated at 18, located between the base plate 10 and the top of the wall 16. The opening 18 is covered by a pivoted elongated door 20 when the door 20 is in the closed position as shown in FIG. 1.

Figure 2:
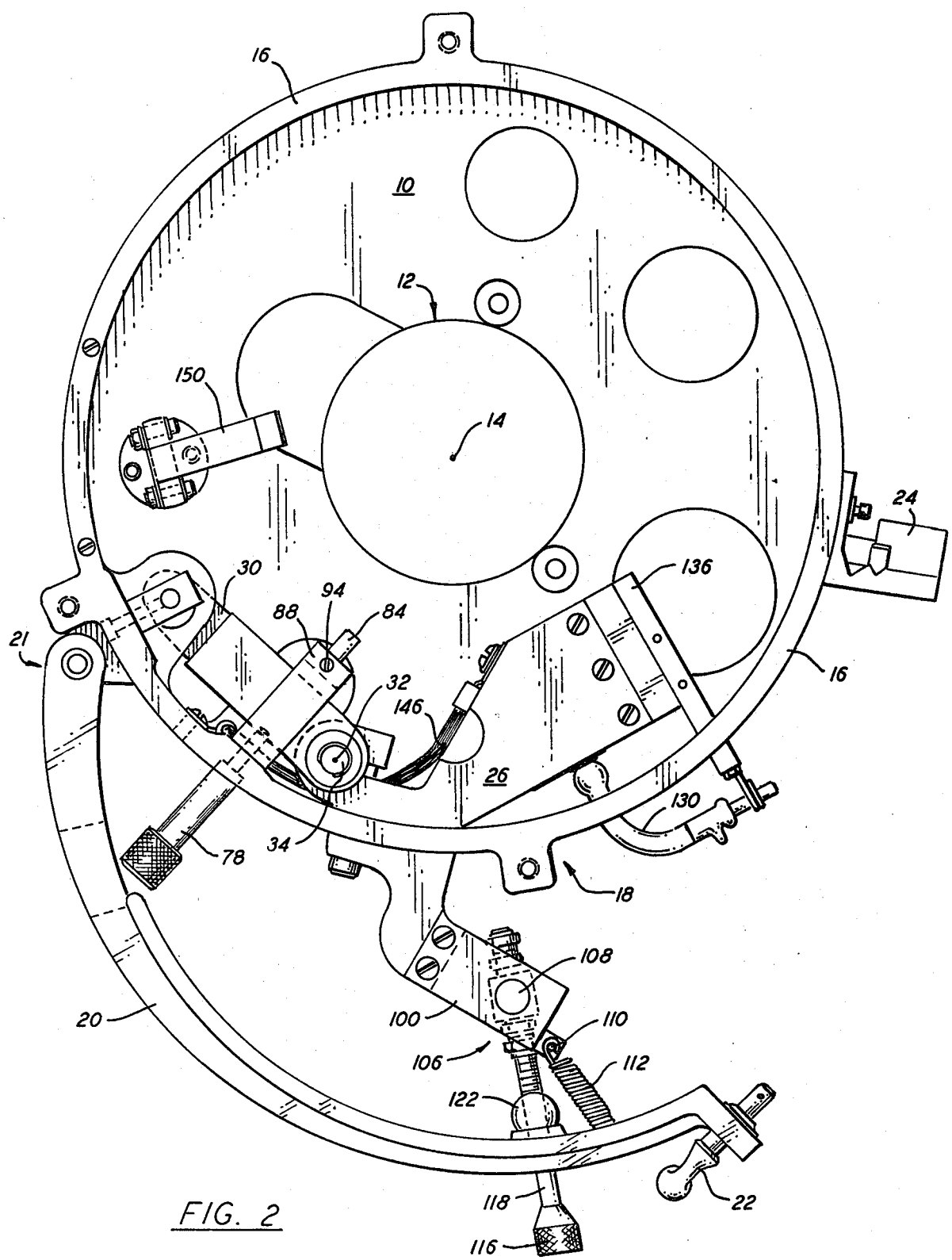
FIG. 2 is a raised, elevational view taken from above showing the elements as positioned when the access door is opened.

The door 20 has a hinge, indicated generally at 21 at one end of the door which is held in the closed position by a door latch 22 located at the other end of the door, the latch 22 engaging a door latch holding means 24 when the latch 22 is in the position shown in FIG. 1. The door latch 22 may be disengaged from the holding means 24. Thereafter, the door 20 may be opened, as illustrated in FIG. 2, so that the pivot plate 26, among other items, may be pivoted to allow it to partially project through the opening 18.

The pivot plate 26 is generally L-shaped and pivoted at the corner of the L by a pivotal connection indicated generally at 28 to the free end of a pivot arm 30. The pivotal connection 28 permits the pivot plate to pivot about a vertical axis, passing through the dot 32 in a direction perpendicular to the sheet of FIG. 1. The exact configuration of the pivotal connection 28 is not critical to the invention; however, it must be of the type which will support the pivot plate 26 so it may freely pivot about the vertical axis passing through the dot 32.

The configuration of the present invention illustrated in FIG. 1 includes a vertically disposed axle 34 mounted near the free end of the pivot arm 30, which is bifurcated in this region. The axle 34 has a longitudinal axis coextensive with the vertical axis passing through the dot 32. Riding on the axle 34 and between the bifurcated free ends of the pivot arm 30 is a bushing 36 having a central opening therethrough just slightly larger than the axle 34 so that it may freely rotate about the vertical axis through the dot 32. The pivot plate 26 is clamped to the bushing 36 by means of a conventional clamping arrangement including a bolt 38. In this manner, the pivot plate 26 is freely pivotable about the vertical axis passing through the dot 32 when the plate is not constrained by other elements coupled thereto.

The pivot arm 30 is pivotally coupled to the base 10 by a pivotal connection indicated generally at 40 which pivots about a vertically disposed axis passing through the dot 42. This pivotal connection is illustrated in greater detail in the sectional view of FIG. 3 wherein two bushings, 44 and 46, are located so the vertical axis 48 passes therethrough. An axle 50 is positioned coaxially with the axis 48 and passing through the bushings, 44 and 46, thereby providing a vertical pivotable connection between the pivot arm 30 and the base 10.

Figure 3:
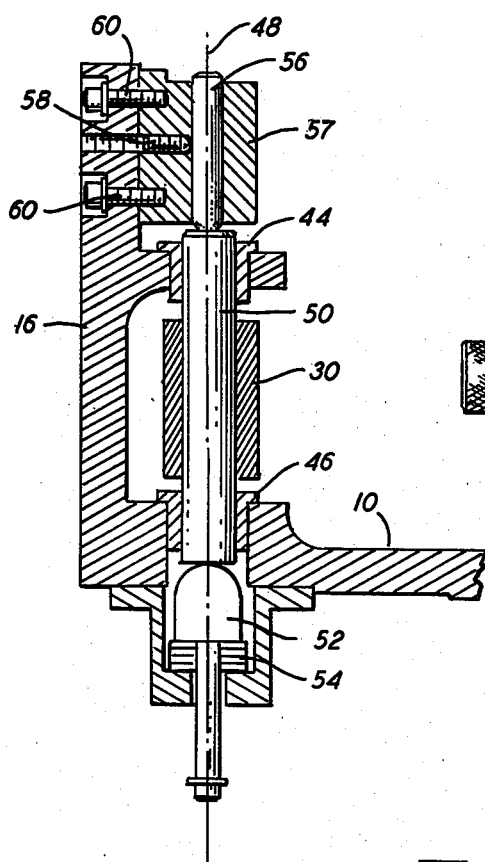
FIG. 3 is a vertical, sectional view along section line A—A of FIG. 1.

The axle 50 is supported from below by a load plunger 52 which is forced upwardly by the spring washers 54. Upward movement of the axle 50 is restrained by a set screw 56 which bears against the upper surface of the axle 50. The set screw 56 is retained in a block 57 at the position shown in FIG. 3 by one additional set screw 58. The block 57 is held to the wall 16 by two screws 60. When the elements of FIG. 3 are properly adjusted, the axle 50 is free to pivot about the vertically disposed axis 48.

Figure 4:
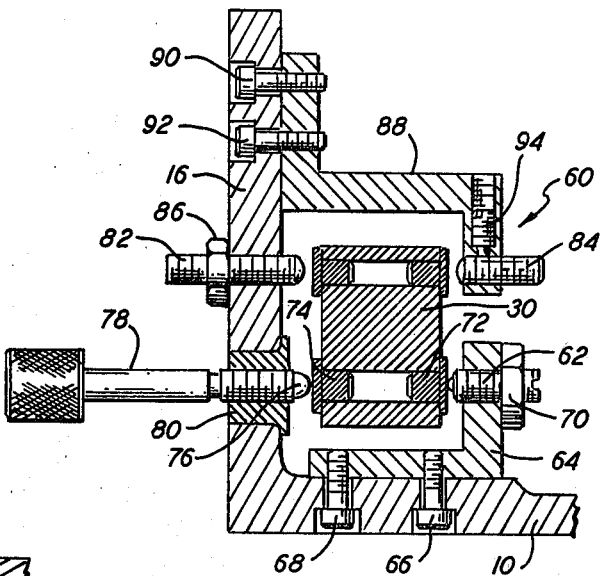
FIG. 4 is a vertical, sectional view along section line B—B of FIG. 1.

Located near the free end of the pivot arm 30 and close to the axle 34 is a pivot arm position adjustment means 61, which is illustrated in greater detail in the vertical sectional view of FIG. 4. The adjustment means 61 includes a ball plunger 62, which is threaded into an L-bracket 64 that is secured to the base 10 by two screws, 66 and 68. The ball plunger 62 can be fixedly located on the bracket 64 by a nut 70, which, when tightened against the bracket 64, secures the plunger 62 in place. The ball plunger 62 engages a flat surface on a metal insert member 72, which is inserted into the right side of the pivot arm 30. Another insert 74, located in the left side of the pivot arm 30 and in line with the insert 72, engages the tip 76 of an adjustment screw 78, which is threaded into an insert 80 in the wall 16. When the adjustment screw 78 is turned in a way to have the tip 76 project farther in a rightward direction as viewed in FIG. 4, the ball plunger 62 permits the pivot arm 30 to move in a rightward direction. On the other hand, when the adjustment screw 78 is turned so that the tip 76 moves in a leftward direction, the ball plunger 62 continues to bear against the insert 72 and applies pressure to the right surface of the pivot arm 30 so as to move it in a leftward direction.

The assembly as illustrated in FIG. 4 also includes a left limit stop 82 and a right limit stop 84. The left limit stop 82 is threaded into the wall 16 and held in place by a nut 86, which is tightened against the wall 16. The right limit stop 84 is mounted in a bracket 88, which is secured to the wall 16 by screws 90 and 92. The right limit stop 84 is positioned as desired and held in place by a set screw 94.

From the foregoing description of the positioner 60 shown in FIG. 4, it is clear that the adjustment screw 78 is operable to move the pivot arm 30 either left or right, as viewed in FIG. 4, which causes the arm 30 to move either in a clockwise or counterclockwise direction, as viewed in FIG. 1, about the vertical axis passing through the dot 42. As such, the pivot arm 30 is pivoted about this axis through the dot 42 thereby causing the free end of the arm 30 to move along an arc which approximates a straight line over the distance permitted by the limit stops 82 and 84.

Figure 6:
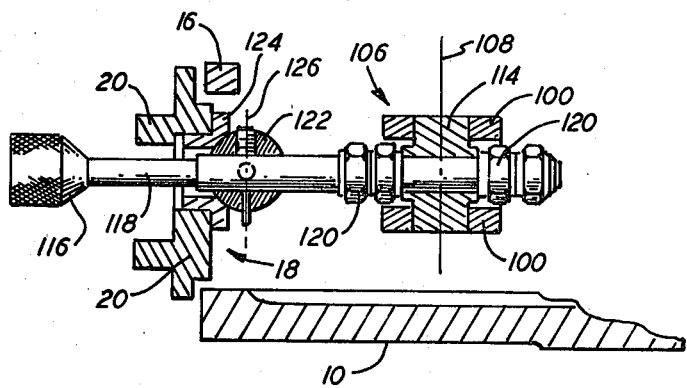
FIG. 6 is a vertical, sectional view along section line D—D of FIG. 1.

As illustrated in FIG. 6, the pivot plate 26 has a yoke extension 100 which is affixed to the pivot plate by two screws 102 and 104. The yoke extension could be part of the pivot plate 26. The yoke extension 100 permits a pivot plate adjustment means, indicated generally at 106, to be pivotally attached to the pivot plate assembly including the plate 26 and the yoke 100 about an axis passing through the dot 108, which is disposed perpendicularly to the plane of the base plate 10. The yoke extension 100 additionally includes a projection 110, to which a tension spring 112 is attached. The other end of the tension spring 112 is coupled to the door 20. The tension spring 112 provides a moment to the pivot plate assembly, about the axis through the dot 108 and also removes the play in the pivot plate adjustment means 106.

The pivot plate adjustment means 106, as illustrated in FIG. 6, includes a trunion member 114, which is fitted into the yoke 100. The pivot plate adjustment means 106 also includes an adjusting knob 116 at the end of the shaft 118 which couples to a position adjustment assembly 120. The shaft 118 projects through an opening in the door 20 and has a pivot ball 122 coupled thereto. The ball 122 fits into an insert 124 affixed into the opening through the door 20 so that the shaft 118 is free to pivot relative to the door about an axis passing through the center of the pivot ball 122. The adjustment means 120 is designed so that when the knob 116 is rotated in one direction or the other, the distance between the pivot axis 126 through the wall 122 and the axis 108 either becomes greater or smaller.

As illustrated in FIG. 1, the pivot plate 26 and the yoke extension 100 form a generally L-shaped pivot plate assembly, which is pivoted at the corner of the L-shaped assembly about the axle 34 and pivoted at one end about the axis 108, which passes through the trunion 114. The dimension of the elements is selected so that the pivot arm 30 and shaft 118 are approximately parallel to each other.

Figure 5:
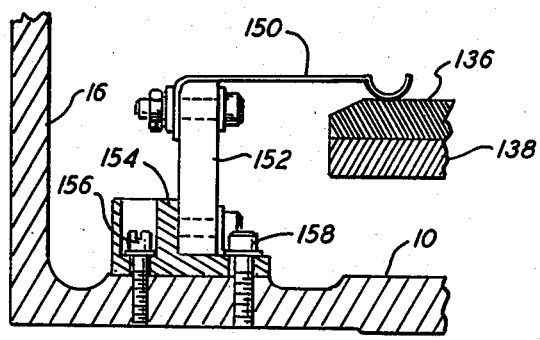
FIG. 5 is a vertical, sectional view along section line C—C of FIG. 1.

Mounted at the other end of the pivot plate assembly is an arcuate lamp 130, which is mounted generally at 132 to the pivot plate 26 in a manner such as is found in the Perkin-Elmer Micralign ™ Model 100 projection mask aligner. The other end of the arcuate lamp 130 is held, but not mechanically constrained by, a flexible coiled connector 134, which is mounted on the extreme end of an electrically conductive member 136. The electrically conductive member 136 is mounted on an insulating plate 138, affixed to an end of the L-shaped assembly by the screws 140, 142 and 144. In this manner, the electrical potential on the conductive member 136 can be different from the electrical potential of the pivot plate 26. Indeed, the pivot plate 26 is coupled by a pigtail wire 146 which is coupled thereto by a screw 148 which threads into the body of the plate 26. The pigtail wire 146 is coupled electrically to the base plate 10 and comprises an electrical ground. A high voltage on the order of 1000 volts is coupled to the conductive member 136 by a connector member 150, which, as illustrated in FIG. 5, is supported on the top of an insulating member 152 that is mounted on a support bracket 154 screwed to the base 10 by screws 156 and 158. An electrical connection is provided to the connector member 150 by a suitable wire (not shown).

The arcuate lamp 130 is a mercury capillary lamp of the type used in a Perkin-Elmer Micralign TM Model 100. When such a lamp is positioned in the lamp holding means located on one end of the L-shaped pivot plate assembly, which includes the plate 26, the yoke extension 100, the insulator 138 and the conducting member 136, the lamp 130 is located above the projection mask aligner optics 12. The lamp 130 can be moved relative to the optics 12 by adjusting knobs 78 and 116. When the knob 78 is turned, the lamp 130 is moved generally in a direction indicated by the double headed arrow 170. When the knob 116 is turned, the lamp 130 is moved generally in a direction indicated by the arrow 172. By adjusting both knob 78 and 116, the lamp 130 can be moved relative to the optics 12 in any direction desired so as to be able to position lamp 130 at virtually any position within the limits of movement established by the mechanical configuration of FIG. 1. These limits, however, have proved to be sufficiently large that each lamp 130 can be positioned with respect to the optics 12 so as to produce the greatest intensity uniformity through the optics 12 for any lamp of the type currently being manufactured by Perkin-Elmer for use in Perkin-Elmer Micralign TM projection mask aligners.

FIG. 2 illustrates the manner in which the elements of FIG. 1 shift position when the door 20 is opened. The pivot plate 26 is pivoted about the axis through dot 32 so that a portion of it projects through the opening 18, allowing access to the lamp 130, which becomes disconnected from electrical power when the connector 150 loses contact with conductor 136. In this manner, the lamp 130 becomes accessible for changing if it becomes necessary to do so.

The present invention has been described with reference to the preferred embodiment, which is illustrated in the drawings. Those of skill in the art will readily recognize, however, that there are numerous equivalent elements which can replace those elements illustrated and which will accomplish the same function and, therefore, not depart from the spirit and scope of the invention as defined in the following claims.

What is claimed is:

1. An assembly for precisely positioning a lamp comprising, in combination:
   a base;
   a door pivotally coupled to said base;
   a pivot arm pivotally coupled at one end thereof to said base;
   a pivot arm adjustment means for adjusting the position of the free end of said pivot arm with respect to said pivot base;
   a pivot plate pivotally coupled about a pivot axis to said free end of said pivot arm, said pivot plate including lamp support means; and
   a pivot plate adjustment means coupled between said pivot plate and said door to adjustably position said pivot plate with respect to said pivot arm to which said pivot plate is coupled while said door remains in one position and to pivot said pivot plate about said pivot axis when said door is moved relative to said base.

2. The assembly of claim 1 wherein said lamp support means includes means to couple one electrical lead from said lamp to said pivot plate and means to couple the other electrical connection to an electrical connector electrically insulated from said base.

3. The assembly of claim 1 including means to couple said lamp support means to a source of electrical power when said door remains in one position and to disconnect electrical power when said door is moved from said one position.

4. The assembly of claim 1 additionally including limit stop means to define the extremes of movement of the free end of said pivot arm.

5. The assembly of claim 1 additionally including a tension spring coupled between said door and the extreme end of said pivot plate at a point adjacent said pivot plate adjustment means.

6. An assembly for precisely positioning a lamp comprising, in combination:
   a base support and a wall disposed generally perpendicularly to said base, said wall having an opening therethrough;
   a door, pivotally attached to said wall adjacent said opening in said wall, said door being movable relative to said wall so that said door covers said opening when said door is closed and said opening is accessible when said door is open;
   a pivot arm pivotally coupled at one end thereof to said base;
   a pivot arm position adjustment means for adjusting the position of the free end of said pivot arm with respect to said base;
   a generally L-shaped pivot plate with two ends and a corner, said pivot plate including a lamp support means generally at one end of said L-shaped plate and a first pivotal coupling with said free end of said pivot arm, said first pivotal coupling being located substantially at the corner of said L-shaped pivot plate; and
   a pivot plate positioning means coupling between the other end of said pivot plate and said door, said pivot plate positioning means including a second pivotal coupling and means to adjust the distance between said second pivotal coupling and said door.

7. The assembly of claim 6 additionally including means to couple said lamp support means to a source of electrical power in a manner permitting adjustment of said pivot arm position adjustment means or said pivot plate positioning means without disconnecting electrical power therefrom.

8. The assembly of claim 6 additionally including a tension spring between said other end of said pivot plate and said door.

9. An assembly for precisely positioning a lamp comprising, in combination:
   a base plate disposed in a horizontal plane;

a wall extending generally vertically from said base plate, said wall having an elongated opening therein;

an elongated door pivotally mounted at one end thereof to said wall so as to cover said elongated opening in said wall when said door is in its closed position;

an arm pivotally mounted at one end to permit said arm to pivot about a first vertical axis;

an arm positioning means for adjustably pivoting said arm about said first vertical axis to position the free end of said arm relative to said wall;

an L-shaped pivot plate with two ends and a corner, said pivot plate being pivotally coupled at its corner to the free end of said arm, said pivot plate pivoting about a second vertical axis through said pivotal coupling at the free end of said arm;

a lamp support means mounted to said pivot plate adjacent one end of said plate;

a pivot plate position adjustment means coupled between a location near the other end of said pivot plate and a location near the end of said door opposite the end of said door which is pivotally mounted to said wall to adjustably select the distance between said pivot plate and said door, said pivot plate pivoting about said first axis when said door is opened to swing said lamp support so as to be accessible through said opening in said wall.

10. The assembly of claim 9 additionally including a tension means disposed between said other end of said pivot plate and a location substantially at the end of said door opposite the end of said door which is pivotally mounted to said wall.

11. The assembly of claim 10 wherein said tension means compresses a spring in tension.

12. The assembly of claim 9 additionally including means to couple electrical power to said lamp support means when said lamp support means when said door is closed and to disconnect electrical power from said lamp support when said door is opened.

13. The assembly of claim 9 or 12 wherein an arcuate lamp is supported by said lamp support means.

14. The assembly of claim 9 wherein the elements thereof are all dimensioned so that adjustment of said arm positioning means causes said lamp support to move in a direction substantially perpendicular to the direction to movement of said lamp support caused by adjustment of said pivot plate position adjustment means.

* * * * *